(12) United States Patent
Nishida (10) Patent No.: US 6,560,686 B1
(45) Date of Patent: May 6, 2003

(54) MEMORY DEVICE WITH VARIABLE BANK PARTITION ARCHITECTURE

(75) Inventor: Shinsuke Nishida, Tokyo (JP)

(73) Assignee: Fourie, Inc., Tokyo (JP)

( * ) Notice: Subject to any disclaimer, the term of this patent is extended or adjusted under 35 U.S.C. 154(b) by 0 days.

(21) Appl. No.: 09/538,969

(22) Filed: Mar. 31, 2000

(30) Foreign Application Priority Data

Apr. 1, 1999 (JP) .......................................... 11-095048

(51) Int. Cl.[7] .............................................. G06F 12/02
(52) U.S. Cl. ......................... 711/173; 711/5; 711/170; 711/171; 711/172
(58) Field of Search ............................ 711/173, 5, 170, 711/172, 171

(56) References Cited

U.S. PATENT DOCUMENTS

| | | | | |
|---|---|---|---|---|
| 5,588,138 A | * | 12/1996 | Bai et al. .................... | 709/100 |
| 5,625,797 A | * | 4/1997 | Ferry et al. .................. | 711/153 |
| 5,644,749 A | * | 7/1997 | Obayashi ..................... | 710/120 |
| 5,757,571 A | * | 5/1998 | Basham et al. ................ | 360/48 |
| 5,956,340 A | * | 9/1999 | Afek et al. ................... | 370/412 |
| 5,969,893 A | * | 10/1999 | Basham et al. ................ | 360/48 |
| 5,995,415 A | * | 11/1999 | Kuo et al. ............. | 365/185.11 |
| 6,003,036 A | * | 12/1999 | Martin ....................... | 707/100 |
| 6,005,803 A | * | 12/1999 | Kuo et al. ............. | 365/185.11 |
| 6,275,894 B1 | * | 8/2001 | Kuo et al. ............. | 365/185.11 |
| 6,385,672 B1 | * | 5/2002 | Wang et al. ................. | 710/305 |

* cited by examiner

Primary Examiner—B. James Peikari
(74) Attorney, Agent, or Firm—Sughrue Mion, PLLC (57) ABSTRACT

In a memory device with variable bank partition architecture, a plurality of bank level signals each of which specifies a number of bank divisions are input from the respective bank level terminals. Further, a plurality of address signals, each of which specifies one of the banks, are input from the address terminals. Data input from data input/output terminals are stored in batch in all access units in a memory address area corresponding to a bank specified by a bank address signal among those obtained by dividing a memory address space or an upper bank based on bank level signals.

10 Claims, 8 Drawing Sheets

| BANK LEVEL | BANK LEVEL (BIT DISPLAY) | BIT NUMBER OF EFFECTIVE ADDRESS | NUMBER OF BANKS |
|---|---|---|---|
| 0 | 0000 | NA | 1 |
| 1 | 0001 | 2 | 4 |
| 2 | 0010 | 4 | 16 |
| 3 | 0011 | 6 | 64 |
| 4 | 0100 | 8 | 256 |
| 5 | 0101 | 10 | 1024 |
| 6 | 0110 | 12 | 4096 |
| 7 | 0111 | 14 | 16384 |
| 8 | 1000 | 16 | 64k |
| 9 | 1001 | 18 | 256k |
| 10 | 1010 | 20 | 1M |

※ADDRESS     : 20BIT(x=19),
　BANK LEVEL : 4BIT(z=3),
　DATA       : 16BIT(y=15)

MEMORY DEVICE WITH VARIABLE BANK PARTITION ARCHITECTURE

FIELD OF THE INVENTION

The present invention relates to a memory device with variable bank partition architecture, which can store data by a desired bank unit and read out the stored data in various ways by dividing a memory address space to a plurality of banks and also specified an address within each of the divided banks.

BACKGROUND OF THE INVENTION

In association with development of a high speed and multi-functional CPU or the tendency for a larger memory capacity of a recording medium, feasibility of the interactive multi-media technology enabling provision of video or audio data has been becoming increasingly higher. Further, in association with popularization of Internet communications based on consolidation of communication infrastructure, it has become possible to provide real time information through a communication line.

A quantity of digital data treated in the multi-technology as described above is substantially larger as compared to a quantity of character data in the conventional technology, so that the data compression technology such as JPEG or MPEG has been developed. When a large quantity of data as described above is to be processed with a computer, a large capacity memory, which can be accessed at a high speed, is required.

The computer once reads the data stored in a recording medium such as a CD-ROM or a magnetic disk into a main memory such as a DRAM (Dynamic Random Access Memory) which can be accessed at a high speed. The data stored in the main memory is directly processed using a CPU. Thus, to process the large quantity of data as described above, it is required that the main memory can be accessed at a high speed and also that the main memory has a large memory capacity.

To achieve the objective described above, there has been developed a technology for improving the entire data processing speed by providing a primary cache memory or a secondary cache memory which can be accessed at a higher speed between the CPU and the main memory for the purpose of improving the data reuse ratio. On the other hand, as for image data, which is a main type of data to be processed in multi-media technology, it is necessary to display the image data on a display unit, such as a CRT or a liquid crystal display unit, at a high speed, so that the image data is processed by a graphic mechanism that can operate independently from the CPU.

The graphic mechanism comprises a graphic control chip that executes a draw command issued from the CPU, and a video memory in which data to be displayed on a display unit is written. The video memory is a portion of a main memory, and the CPU writes the data to be displayed therein. Recently the SDRAM (Synchronous DRAM) or SGRAM (Synchronous Graphic RAM) is often used as the video memory.

As described above, in most computer systems, a plurality of large capacity memories are distributed on a system so that a large quantity of data, especially image data such as still pictures or moving pictures can be processed at a high speed.

In the computer systems for image data processing as described above, however, the same data is often expanded over two or more successive areas. Also, when the data expanded over a plurality of areas is stored in a video memory, it is necessary to specify an address for each pixel that forms the screen of the display unit.

Especially when resolution of an image to be displayed is lower as compared to that of a display unit, it is necessary to store data corresponding to one dot in the image data over a plurality of successive storage areas on a video memory. The same necessity occurs also when image data containing scarce image information is repeatedly enlarged for display. For instance, when data for one pixel in image data is reproduced on a display unit with high resolution, the data for one pixel is displayed as a rectangle consisting of 4×4=16 dots on the display unit.

Further, a memory used as a main memory for a CPU has the same configuration as that used as a video memory, and is not specifically differentiated when shipped as a memory chip.

Further, a large capacity memory is often used in an input/output mechanism that functions as an interface with a peripheral device, such as a display unit, or in a peripheral device itself, such as the graphic mechanism as described above. In such cases, the same problem that occurs in a video memory will occur in a data buffer incorporated, for instance, in a printer.

As described above, in the conventional type of memory, it is required to execute the processing for storing the same data specifying an address to each of different sections of an area where the data is present regardless of contents of data to be stored or resolution thereof. Especially in the multi-media technology, a plurality of window screens are displayed on a display screen, and different types of processing such as enlargement or compression are executed to the window screens respectively, so that it has been required to improve the efficiency in processing for specification of addresses.

SUMMARY OF THE INVENTION

It is an object of the present invention to provide a memory device with variable bank partition architecture in which, by specifying a number of divisions (bank level) to divide a memory address space to a plurality of banks and further specifying an address to each of the divided banks, it is possible to store data in batch in an area in a specified bank and also to read out the stored data in various ways.

In the memory device with variable bank partition architecture according to one aspect of the present invention, data input from data input terminal is stored in all access units in a memory address area corresponding to banks specified by bank specification address signals among those obtained by dividing the memory address area according to a number of divisions specified based on a bank level signal, and the same data can be stored in a desired memory space only with one bank specification instruction (an instruction for inputting a bank level signal and a bank specification address signal) issued from a CPU of a computer.

In the memory device with variable bank partition architecture according to another aspect of the present invention, data input from the data input terminals is stored in all access units in a memory address area corresponding to a bank specified by a bank specification address signal input from an address terminal dedicated to an operation for writing data of those obtained by dividing a memory address space based on a number of divisions specified by a bank level signal, and further data at a memory address specified by an address signal input from an address terminal dedicated to an operation for reading out data is output from data output terminals.

In the memory device with variable bank partition architecture according to still another aspect of the present invention, data input from data input terminals is stored in all access units in a memory address area corresponding to a bank specified by a bank specification address signal input from the address terminal dedicated to an operation for writing data among those obtained by dividing a memory address spaced based on a number of divisions specified by a bank level signal, and data at memory addressed sequentially and automatically specified among specified memory addresses is output in response to input of a synchronizing clock.

Other objects and features of this invention will become apparent from the following description with reference to the accompanying drawings.

DESCRIPTION OF THE PREFERRED EMBODIMENTS

Memory device with variable bank partition architecture according to embodiments of the present invention are explained in detail below with reference to the related drawings. The present invention is not limited to these embodiments.

Figure 1:
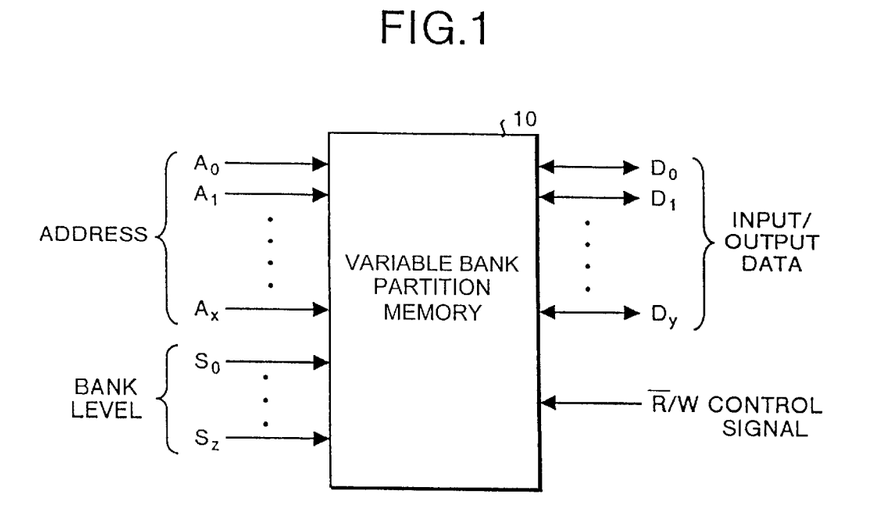
FIG. 1 is an explanatory view showing a memory device with variable bank partition architecture according to a first embodiment of the present invention.

FIG. 1 shows a memory device with variable bank partition architecture according to a first embodiment of the present invention. Memory device with variable bank partition architecture 10 comprises a plurality of address terminals that receive an address signal, a plurality of bank level terminals that receive a bank level signal, a plurality of data input/output terminals which receive a data to be stored or output the stored data, and a control terminal which receive a control signal for specifying a direction of data input into or output from the data input/output terminals. In other words, the control signal specify either input of data (data write) or output of data (data read).

In FIG. 1, reference numerals $S_0$ to $S_z$ indicate a bank level signals, which is a input signal indicating a way of dividing a memory address space in the memory device with variable bank partition architecture 10. Each of the signals $S_0$ to $S_z$ consists of a plurality of bits, for instance, 4 bits. In this case, z is equal to 3, and any of bank levels from 0 to 15 can be specified.

Reference numerals $A_0$ to $A_x$ indicate address signals, which is an input signal specifying one of banks obtained by dividing a memory area space according to a bank level indicated by any of the bank levels $S_0$ to $S_z$. Each of the address signals $A_0$ to $A_x$ consists of a plurality of bits, for instance, 20 bits. In this case, x is equal to 19, and one of $2^{20}$ addresses in a memory address space can be specified.

Reference numerals $D_0$ to $D_y$ indicate data input into or output from the memory device with variable bank partition architecture 10, and consists of a plurality of bits, for instance, 16 bits. In this case, y is equal to 15, and 2-byte storage unit is stored at addresses specified by the address signals $A_0$ to $A_x$. The R (with an upper bar)/W indicates the control signal described above, which is a signal for reading out or writing data according to instructions by a computer program or the like. In this example, data read is instructed when the logic level is "L", and data write is instructed when the logic level is "H".

Generally a bit number of each of the address signals $A_0$ to $A_x$ and a bit number of data $D_0$ to $D_y$ are determined by the width of an address bus in a system in which the memory device with variable bank partition architecture 10 is loaded, and the width of an internal data bus. It is possible to input the bank level signals $S_0$ to $S_z$ by using a portion of a control bus in the system. Further, it is possible to input a chip select signal, a clock signal, and other dedicated timing signals each used for activating the memory device with variable bank partition architecture 10 or deciding input/output timing for the address signals $A_0$ to Ax or data $D_0$ to $D_y$.

Figure 2:
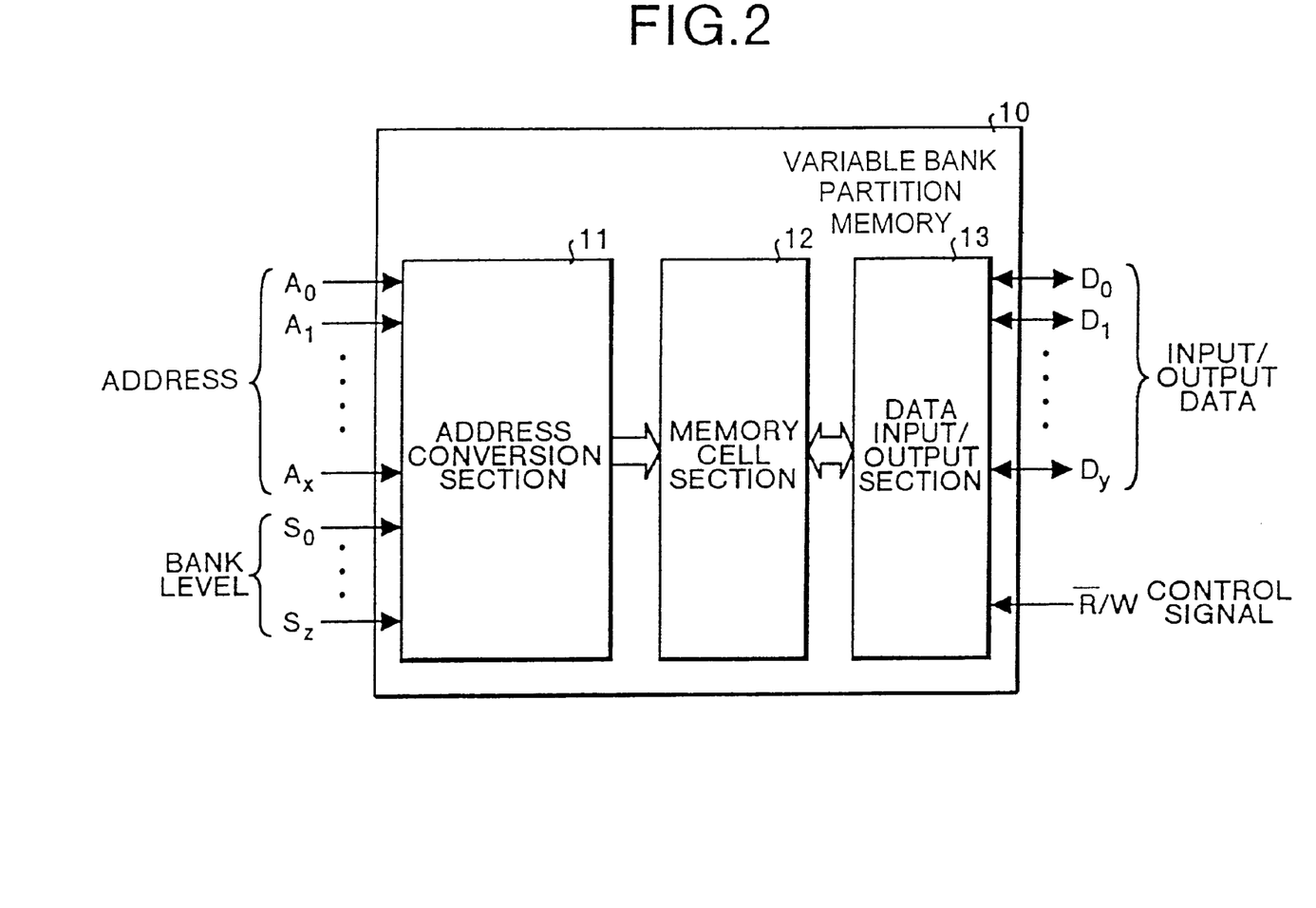
FIG. 2 is a block diagram showing general internal configuration of the memory device with variable bank partition architecture according to the first embodiment.

FIG. 2 is a block diagram showing general internal configuration of the memory device with variable bank partition architecture 10 according to the first embodiment. The memory device with variable bank partition architecture 10 comprises, as shown in FIG. 2, an address conversion section 11, a memory cell section 12, and a data input/output section 13. In FIG. 2, when the bank level signals $S_0$ to $S_z$ and address signals $A_0$ to $A_x$ are input into the memory device with variable bank partition architecture 10, the address conversion section 11 at first decides upon an effective bit of the input address signals $A_0$ to $A_x$ based on a bank level indicated by the bank level signals $S_0$ to $S_z$.

The term "bank level" as defined herein indicates a state of division corresponding to a number of banks obtained by dividing a memory address space. For instance, a bank level 0 corresponds to no division, a bank level 1 corresponds to four divisions (bank number), a bank number 2 corresponds to a bank number of 16, and the like. However, a bank level is practically used to decide a number of effective bits of input address signals $A_0$ to $A_x$ as described above. For instance, a bank level 2 indicates that upper four bits of address signals $A_0$ to $A_x$ expressed by 20 bits are processed as an effective address signal.

Figure 3:
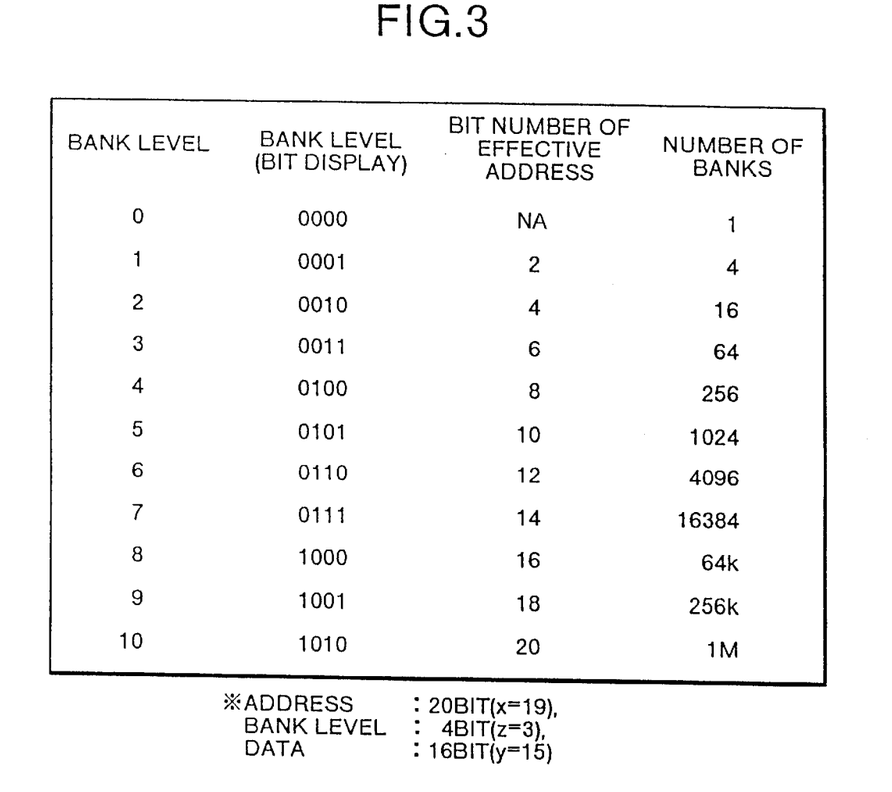
FIG. 3 shows an example of a table in which relations among bank level signals, address signals, bank levels, bit displays for bank levels, effective address bit numbers, and number of banks.

FIG. 3 illustrates a table showing a relation among a bank level, a bit display, and a bit number of an effective address described, and a number of banks when the bank level signals $S_0$ to $S_z$ consist of 4 bits (z=3), address signals $A_0$ to $A_x$ consist of 20 bits (x=19), and data $D_0$ to $D_y$ (z=15). In the table shown in FIG. 3, the bank levels are up to 10, and it is possible to specify one of 1 M address spaces with the minimum division unit.

In this case, when a memory cell comprising a 1 M×2 (bytes), namely 16 M-bit cell is used as a memory cell section 12, the bank levels up to bank levels 10 are available. A bit (1011 or on) indicates a bank level 11 or on can be specified, but as a physical space of a memory cell is not present, the bit is processes as that indicating the bank level 10.

The address conversion section 11 then extracts an effective bit from the address signals $A_0$ to $A_x$ by recognizing a bank level. In the following description, this effective bit is described as effective address. This effective address is the information used in the memory cell section 12 for dividing a memory address space to banks and specifying one of the banks obtained by dividing the memory space.

A memory cell section in a semiconductor memory, such as any of a DRAM (Dynamic Random Access Memory), an SRAM (Static Random Access Memory), a SDRAM (Synchronous DRAM), a PROM (Programmable Read Only Memory), an EPROM (Erasable PROM), a flash memory, or a FRAM (Ferro-electric RAM), may be used as the memory cell section 12 in the memory device with variable bank partition architecture 10. Whether the memory cell is volatile or nonvolatile is not important. Description of this example is, however, based on the assumption that a memory in which data can be written is used.

Figure 4:
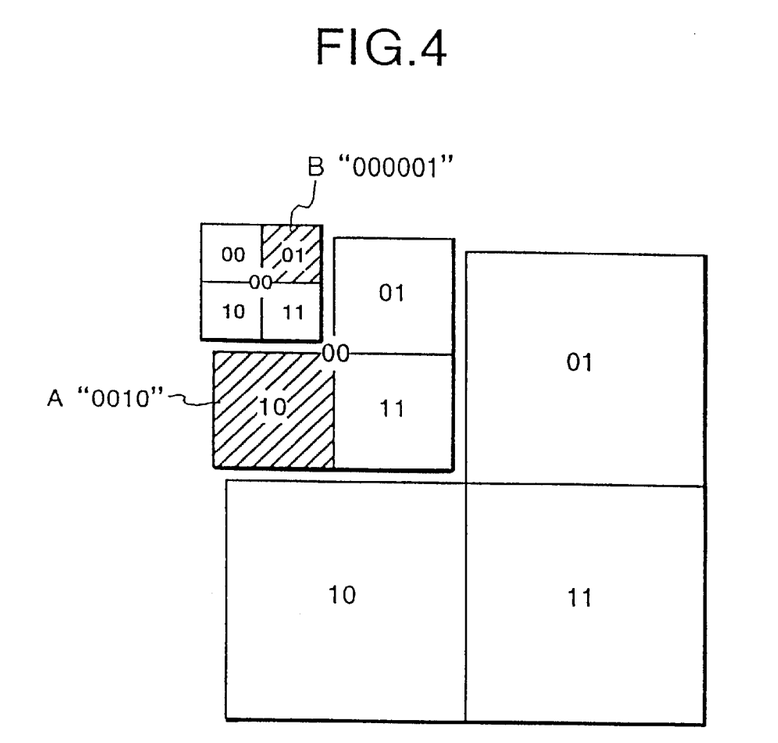
FIG. 4 is an explanatory view showing division of a memory address space to banks and assignment of addresses to the banks.

FIG. 4 explains division of a memory address space to banks and assignment of an address to each band. In FIG. 4, the memory cell section 12 is described with reference to a case where the memory cell section 12 is divided into 8×8 bank matrix corresponding to a bank level 3. The following description assumes, for convenience of description, a case where the memory device with variable bank partition architecture 10 is used as a memory, and further it is assumed that a surface of the memory cell 12 corresponds to a screen of a display unit and a minimum access unit (2 bytes in the example described above) corresponds to one pixel on the screen.

At first, as shown in FIG. 4, the memory cell section 12 is divided into four equal areas. In other words, the memory cell section 12 is expressed as a 2×2 bank matrix. 2-bit code "00", "01", "10", and "11" are assigned to the four areas from the left upper position, right upper position, left lower position, and right lower position. Each of the banks obtained by dividing the memory space is further divided into four areas. In other words, the entire memory cell section 12 is expressed as a 4×4 bank matrix. Further, 2-bit code is assigned to each of the banks obtained by dividing upper banks respectively. Each of the banks obtained as described above is further divided to four areas, and 2-bit code is assigned to each of the banks obtained as described above. In other words, the entire memory cell section 12 is expressed as an 8×8 bank matrix. In addition to the way of division as described above, other ways of division in which division is made in the vertical direction may be employed.

When code assigned to a bank expressing a large area is defined as an upper bit, for instance, a bank A in FIG. 4 can be expressed as "0010", while a bank B can be expressed as "000001". As described above, a bank that is a minimum bank of a matrix and a band (upper bank) comprising a plurality of the banks, each as the minimum unit, can be identified with bit code. This bit code is described as a bank address hereinafter.

When the bank level signals $S_0$ to $S_z$ and address signals $A_0$ to $A_x$ are input into the memory device with variable bank partition architecture 10, it is possible to specify desired areas in the memory address space as banks. As a practical matter, each memory cell included in the identified band is selected by access unit. In this example, 16 pieces (2 bytes) of memory cell enabling storage of 1-bit data is the access unit.

In this state, when data $D_0$ to $D_y$ are input into the data input/output terminal, and at the same time a signal that indicates an input of the data (logic level "H" in this example) is input as a control signal into the control terminal, the data input/output section 13 writes the input data $D_0$ to $D_y$ into all of the access units of the areas selected, based on the bank level signals $S_0$ to $S_z$ and address signals $A_0$ to $A_x$. This writing operation may be executed in batch by successively selecting access units in an identified bank based on clock signals not shown in the figure and executing the operation for each selected access unit, or by activating all the access units in the identified bank.

For instance, with reference to the table in FIG. 3, when the bank B shown in FIG. 4 corresponds to the address "000001" at the bank level 3 in the memory cell section 12 having at maximum a 12 M-byte memory address space, an access unit will consist of 16384 addresses, which are equivalent to 1/64 of the maximum access unit of 1 M (1,048, 576). Herein a signal that indicates input of data (logic level "H" in this example) indicating data input is input as a control signal, the same data, namely the input 2-byte data $D_0$ to $D_{15}$ are written at all of the 16384 access units. Data storage is achieved in this manner.

On the other hand, when the stored data is read out, namely when a signal indicating an output of data (logic level "L" in this example) is input as a control signal, by inputting a bank level signal indicating the highest bank level and an address signal for the maximum effective bit number, selection of an access unit is executed based on these signals, and each bit data stored in the selected access unit is output as data $D_0$ to $D_y$.

Different types of data input by specifying smaller banks may be present in a range specified by a bank level signal and an address signal in each access unit. When the data is to be output, by inputting a bank level signal indicating an arbitrary level other than the maximum bank level to a bank level terminal to specify a bank of data included in the specified bank, data indicating the maximum value or minimum value may be output as data $D_0$ to $D_y$. This can be achieved by providing a computing section for computing a maximum value or a minimum value in each specified bank. In addition, by providing a computing section for computing an average value of data included in a specified bank, the average value may be output as the data $D_0$ to $D_y$.

In the case described above, the memory device with variable bank partition architecture is used, and especially the memory cell section 12 and a screen of a display unit are correlated in the 1:1 form. However, the division shown in FIG. 4 is conceptual, and generally a relative position of an access unit on the memory cell section 12 and a pixel on a screen do not correspond to each other in the 1:1 form. Further, the memory device with variable bank partition architecture 10 can be used not only as a video memory, but also as a buffer memory loaded in a printer or a main memory of a computer, and there is no specific limitation over use thereof.

As described above, the memory device with variable bank partition architecture 10 according to the first embodiment of the present invention is a memory device with variable bank partition architecture in which a memory address space is divided to bank units and a particular area of the memory address space is specified by specifying each of the banks. The memory device with variable bank partition architecture 10 receives a bank level signal which specifies a number of banks obtained by dividing a memory address space, and a bank specification address signal which specifies one of the banks, and stores therein data input from a data input/output terminal in all of access units in a memory address area corresponding to a bank specified by the bank specification signal among banks obtained by dividing a memory address space based on the number of banks specified by the bank level signal. Because of this configuration, the same data can be stored over desired memory areas all at once with one bank specification instruction (instruction for inputting a bank level signal and a bank specification address signal). Therefore, load on the CPU in a system incorporating the memory device with variable bank partition architecture is reduced, and throughput of the entire system can be improved.

A memory device with variable bank partition architecture according to a second embodiment of the present invention is explained below. The memory device with variable bank partition architecture according to the second embodiment is different from that according to the first embodiment described above. Specifically, data input and data output can be executed independently and asynchronously because a dedicated input terminal for data input and a dedicated output terminal for data output are provided therein. In other words, in the memory device with variable bank partition architecture according to the second embodiment, data can be written in each band like in the first embodiment, and in addition the data stored as described above can be read out concurrently with the operation for writing data.

Figure 5:
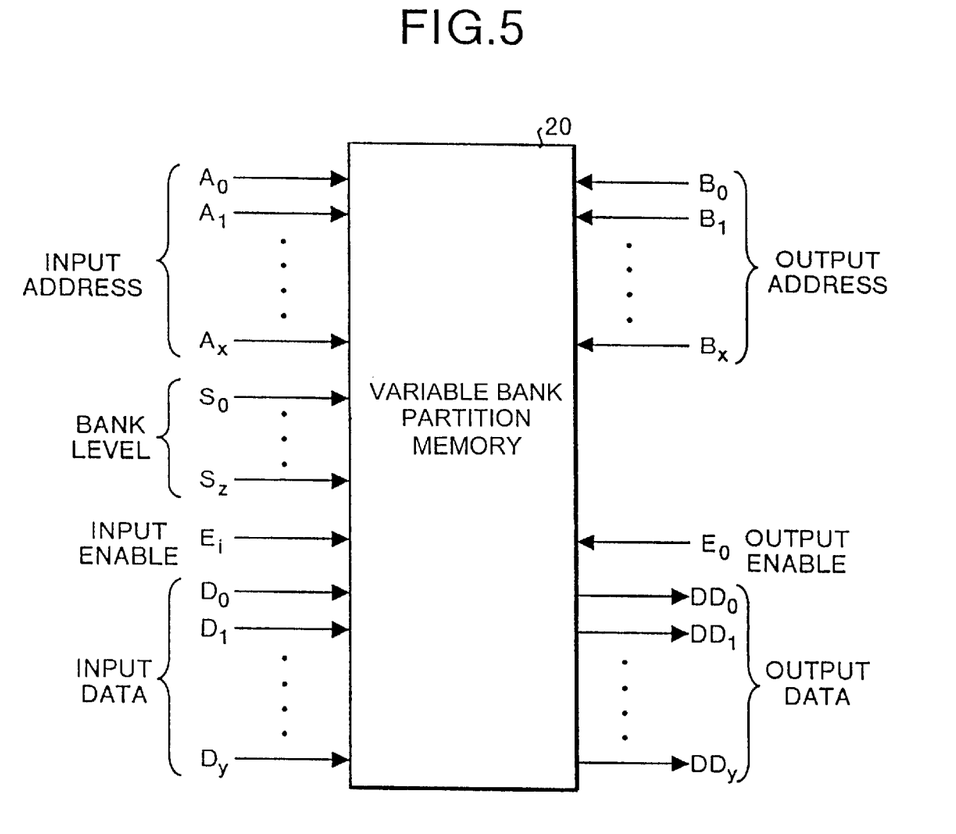
FIG. 5 shows a memory device with variable bank partition architecture according to a second embodiment of the present invention.

FIG. 5 shows the memory device with variable bank partition architecture according to the second embodiment. In FIG. 5, the memory device with variable bank partition architecture 20 comprises a plurality of data input terminals for inputting data to be stored, a plurality of input address terminals for inputting an address signals for writing the data input into the data input terminal, a plurality of bank level terminals for inputting bank level signals like in the first embodiment, an input enable terminal for enabling data input, a plurality of data output terminals for outputting the stored data, a plurality of output address terminals for inputting address signals for reading the data from the data output terminals, and an output enable terminal for enabling data output.

In FIG. 5, reference numerals $S_0$ to $S_z$ indicate bank level signals, and are the same as those shown in FIG. 1, so that their explanation is omitted. Reference numerals $A_0$ to $A_x$ indicate signals similar to the address signals shown in FIG. 1, however, these are the signals that specify at which address of a memory address space the data input into the data input terminal is to be written. Moreover, they are different from the first embodiment in that these signals are not used for specifying output of the data.

Reference numerals $D_0$ to $D_y$ indicate data input into a memory device with variable bank partition architecture 20. Like in FIG. 1, the data consists of a plurality of bits, but different from the first embodiment, the memory device with variable bank partition architecture 20 does not output data. Reference numeral $E_i$ indicates an input enable signal which is equivalent to the control signal for writing data in the first embodiment, and data can be input only when this input enable signal is active (for instance, logic level "L").

Reference numerals $B_0$ to $B_x$ are the output address signals that are same as those shown in FIG. 1, and these output address signals $B_0$ to $B_x$ are signals for specifying data at which address on a memory address space is to be output from the data output terminal. Reference numerals $DD_0$ to $DD_y$ indicate data output from the memory device with variable bank partition architecture 20, and the data comprises a plurality of bits. Reference numeral $E_0$ indicates an output enable signal which corresponds to the control signal for specifying data read in the first embodiment, and data output can be executed only when this output enable signal is active (for instance, logic level "L").

It is possible to input a chip select signal, a clock signal, and other dedicated timing signals, each used for activating the memory device with variable bank partition architecture 20 itself or for specifying input/output timing for the input address signals $A_0$ to $A_x$, output signals $B_0$ to $B_x$, input data $D_0$ to $D_y$, output data $DD_0$ to $DD_y$ or the like. However, such signals are not shown in this figure.

Figure 6:
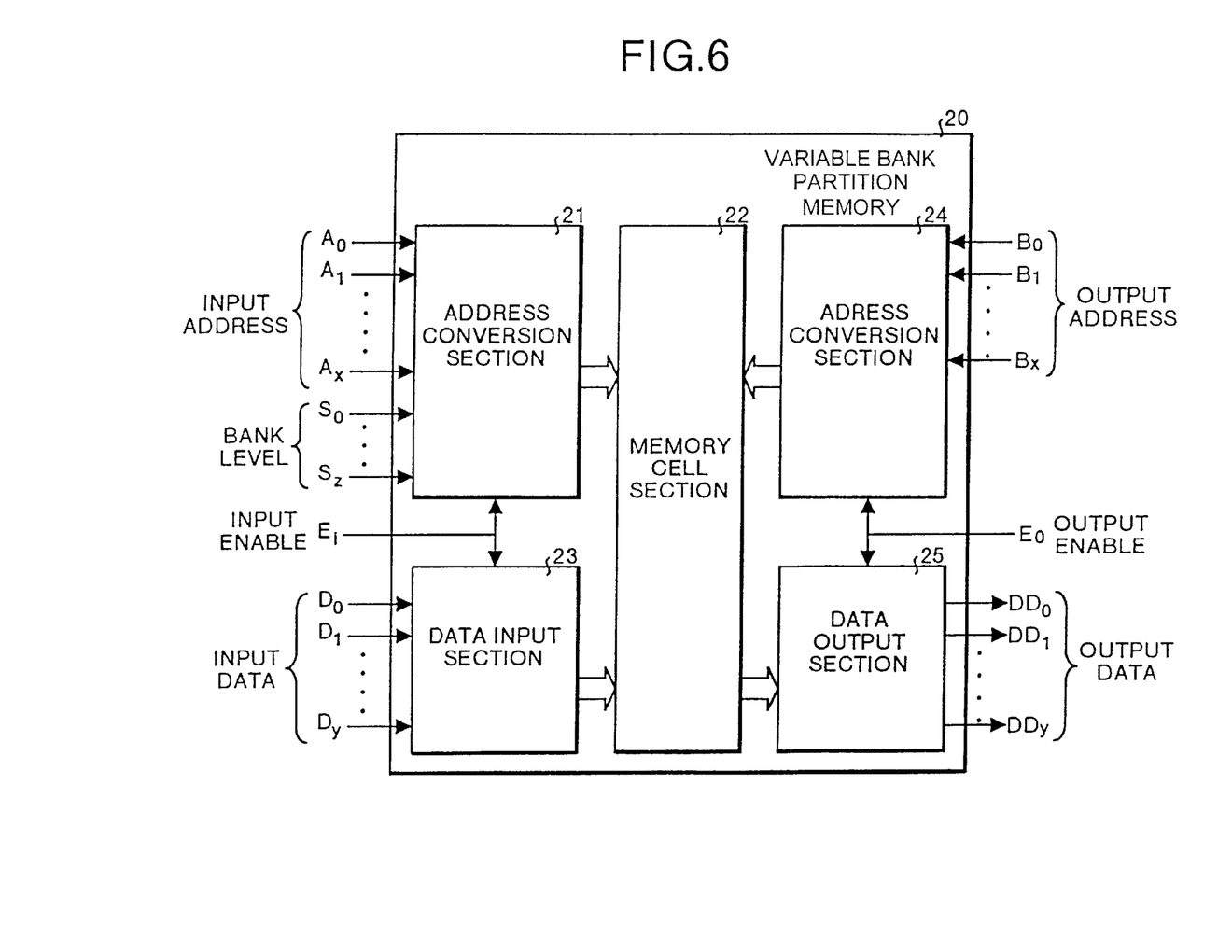
FIG. 6 is a block diagram showing general internal configuration of the memory device with variable bank partition architecture according to the second embodiment.

FIG. 6 is a block diagram showing general internal configuration of the memory device with variable bank partition architecture according to the second embodiment. In FIG. 6, the bank level signals $S_0$ to $S_z$ are same as those explained in the first embodiment, and also the input address signals $A_0$ to $A_x$ are same as those dedicated to input data described in the first embodiment. Accordingly, an address conversion section 21 and a memory cell section 22 execute the same operations as those executed in the address conversion section 11 and memory cell section 12 shown in FIG. 2. Therefore, explanation of these two sections is omitted. Internal configuration of the memory device with variable bank partition architecture 20 is different from that shown in FIG. 2 in that, the data input/output section 13 shown in FIG. 2 is divided into a data input section 23 for controlling data input and a data output section 25 for controlling data output. Further, an address conversion section 24 is additionally provided for inputting the output address signals $B_0$ to $B_x$ and specifying a memory address on the memory cell section 22.

Operations of the memory device with variable bank partition architecture 20 are explained below. At first, the memory device with variable bank partition architecture 20 identifies a particular area on a memory address space as described above when it receives the bank level signals $S_0$ to $S_z$ and address signals $A_0$ to $A_x$. In this case, actually the address conversion section 21 selects an access unit indicates as a lowest order bank address in the identified bank.

In this state, when the input enable signal $E_i$ is activated, the data input section 23 writes input data $D_0$ to $D_y$ in each of the access units selected by the address conversion section 21. Data storage is achieved in this manner.

When an output enable signal $E_0$ is activated for data output, namely for reading out stored data, the address conversion section 24 receives the output address signals $B_0$ to $B_x$ and specifies an address in a memory address space on the memory cell section 22. When the address is specified, an access unit is selected, and then a data output section 25 outputs each bit data stored in the selected access unit.

As described above, with the memory device with variable bank partition architecture 20 according to the second embodiment, input data terminals and input address terminals each dedicated to an operation for writing data are provided, and further data output terminals and output address terminals each dedicated to an operation for reading out data are provided. Because of this configuration, in addition to the effect in the memory device with variable bank partition architecture 10 according to the first embodiment, there is provided the advantage that an operation for writing data and an operation for reading data can be executed independently and asynchronously in response to signals input to the input enable terminal or output enable terminal.

With the memory device with variable bank partition architecture 20 according to the second embodiment, especially when a plurality of programs are concurrently executed on a CPU, or when the memory device with variable bank partition architecture 20 is used as a shared memory which is accessed by a plurality of processors, time required for memory access can be shortened, and also the efficiency in use of a memory can be improved.

A memory device with variable bank partition architecture, according to a third embodiment of the present invention, is explained below. The memory device with variable bank partition architecture memory according to the third embodiment is different from that according to the second embodiment in that, the output terminals shown in FIG. 5 are not provided. Further, an output synchronizing clock terminal is additionally provided for obtaining timing for generating an address of data output from the data output terminals.

Figure 7:
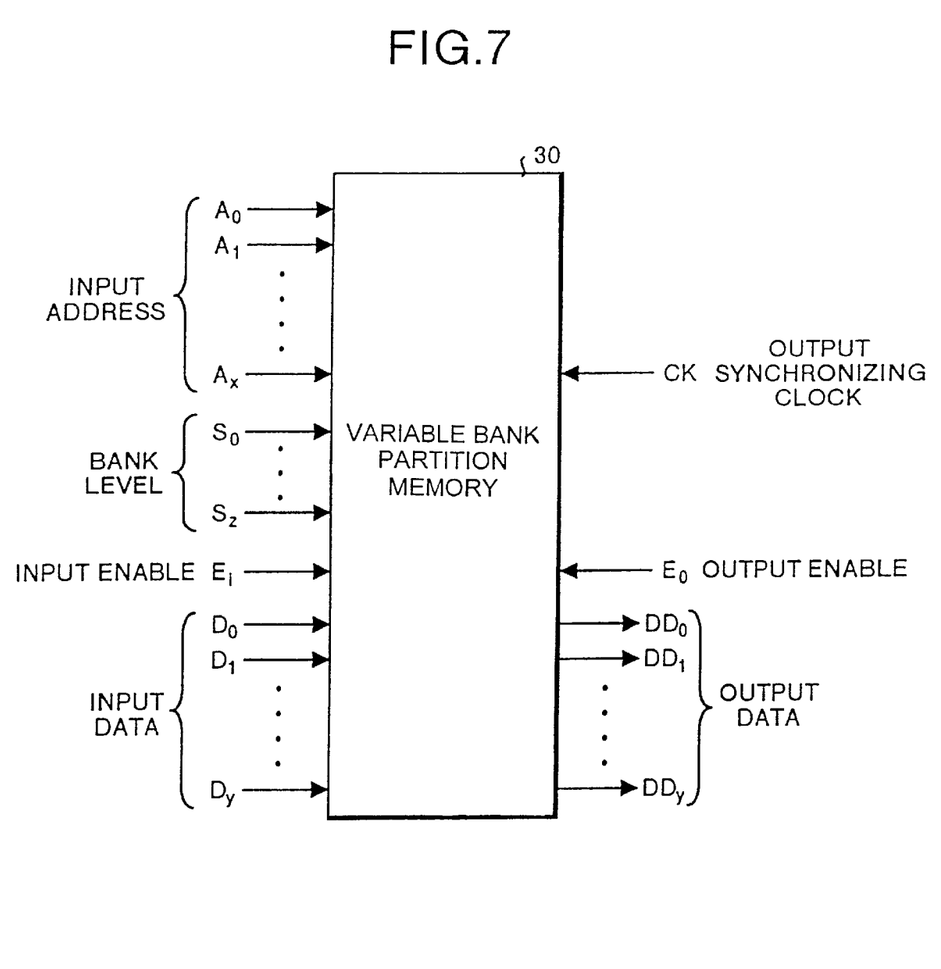
FIG. 7 shows a memory device with variable bank partition architecture according to a third embodiment of the present invention.

FIG. 7 shows a memory device with variable bank partition architecture according to the third embodiment. In FIG. 7, a memory device with variable bank partition architecture memory 30 comprises, like the memory device with variable bank partition architecture 20 shown in FIG. 5, a plurality of data input terminals for inputting data to be stored, a plurality of input address terminals for inputting an address signal for writing data input to the data input terminals, a plurality of bank level terminals for inputting a bank level signal, an input enable terminal for enabling input of data, a plurality of data output terminals for outputting the stored data, and an output enable terminal for enabling output of data. Further, the memory device with variable bank partition architecture 30 comprises an output synchronizing clock terminal for inputting a synchronizing clock signal for reading out data from the data output terminals.

Explanation of the signals in FIG. 7 that are the same as those shown in FIG. 5 is omitted. That is, explanation of input address signals $A_0$ to $A_x$, band level signals $S_0$ to $S_z$, input data $D_0$ to $D_y$, input enable signal $E_i$, output data $DD_0$ to $DD_y$, and output enable signal $E_0$ is omitted.

Figure 8:
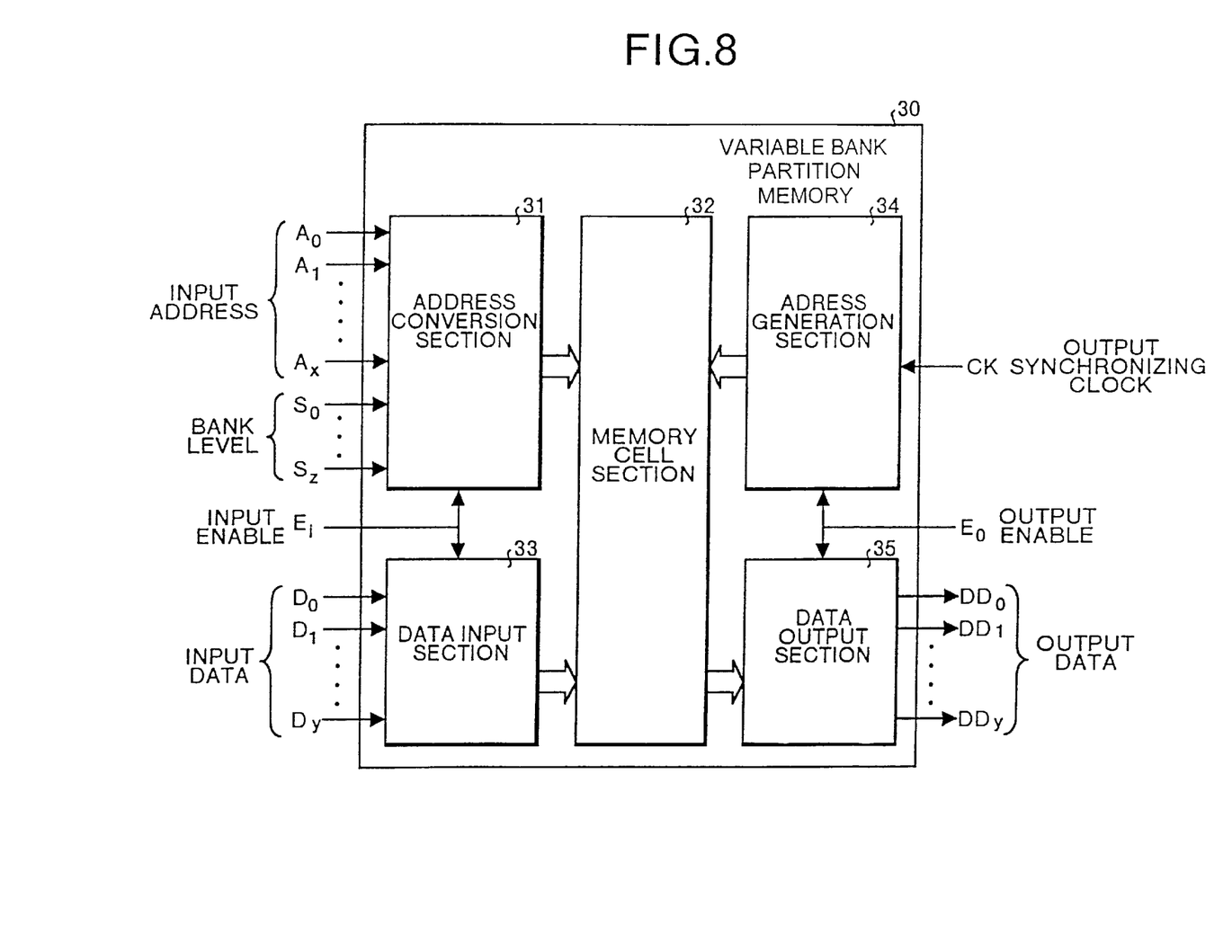
FIG. 8 is a block diagram showing general internal configuration of the memory device with variable bank partition architecture according to the third embodiment.

FIG. 8 is a block diagram showing general internal configuration of the memory device with variable bank partition architecture 30 according to the third embodiment. In FIG. 8, address conversion section 31, data input section 33, memory cell section 32, and data output section 35 execute the same operations as those executed by the address conversion section 21, data input section 23, memory cell section 22, and data output section 25 respectively. Therefore, explanation of these sections is omitted. In the memory device with variable bank partition architecture 30, an address generation section 34 is provided in place of the address conversion section 24 shown in FIG. 6.

Because of the configuration described above, the memory device with variable bank partition architecture 30 is different in the way of reading out data from that in the second embodiment. Operations for reading out data stored in the memory device with variable bank partition architecture 30 are explained below. At first, when data is output, that is when stored data is read out, it is necessary in the second embodiment that the output enable signal $E_0$ is active.

When the output enable signal $E_0$ is active, the address generation section 34 receives the output synchronizing clock CK, and each time one clock pulse of this output synchronizing clock CK is counted, addresses in a memory address space are specified successively from the header address. In other words, with this operation, one access unit is selected. The data output section 35 then outputs each bit data stored in the selected access unit from the data output terminal. That is, the memory device with variable bank partition architecture 30 can automatically and sequentially generate an address for specifying output in synchronism to the output synchronizing clock CK, and also can concurrently output data (consisting of a plurality of bits) stored at the generated address from a plurality of data output terminals.

Data corresponding to all of addresses in a memory address space maybe output, or data maybe output by deciding an address range from which data is to be output, inputting anew the input address signals $A_0$ to $A_x$ (functioning also as output address signals in this case) from the input address terminals, and outputting data from a first one among addresses automatically and sequentially generated.

Especially when the memory device with variable bank partition architecture 30 is used as a video memory, a memory address area of the video memory consists of an area actually displayed on a screen of a display unit (on-screen area), and an area not shown on the screen (off-screen area), and a header address in the on-screen area may be specified as an address signal when the data output described above is executed.

Further, in the memory device with variable bank partition architecture 30, a plurality of data output terminals are provided for enabling parallel data output, but data comprising a plurality of bits and stored in each access unit may be output from specified addresses sequentially.

As described above, with the memory device with variable bank partition architecture 30 according to the third embodiment, when stored data is output, bit data corresponding to a specified address in an access unit is sequentially output. Thus, when continuous data is output, the necessity of specifying addresses one by one is eliminated, and because of this configuration, it is possible to reduce workload for memory access by a CPU or a memory controller.

In the first to third embodiments described above, various ways of specifying an address including a way of specifying a memory cell by specifying a row address and a column address such as that executed in the SPRAM or ROM, or a way of specifying a row address and a column address such as that executed in the DRAM may be employed. Thus, there is no specific limitation over the way of specifying an address in the present invention. Further, other control signal may be used as the input enable signal or as the output enable signal.

As described above, according to the memory device with variable bank partition architecture of one aspect of the present invention, data input from data input terminal is stored in all access units in a memory address area corresponding to banks specified by bank specification address signals among those obtained by dividing the memory address area according to a number of divisions specified based on a bank level signal, and the same data can be stored in a desired memory space only with one bank specification instruction (an instruction for inputting a bank level signal and a bank specification address signal) issued from a CPU of a computer. Accordingly, the work load on the CPU in a system incorporating this memory device with variable bank partition architecture is reduced, and throughput of the entire system can be improved.

Further, in the memory device with variable bank partition architecture described above, a control signal input from a control terminal instructs output of data, a maximum value, a minimum value, or an average value is computed for all of the access units in a memory address area corresponding to a bank specified by a bank specification address among those obtained by dividing the memory address area based on a number of divisions specified with a bank level signal, and a result of computing is output as output data from the data input/output terminals. Accordingly, in addition to the effect described above, a statistic numerical value of data stored in a desired memory area (specified bank) can be obtained in batch, only with one bank specification instruction (an instruction for inputting a bank level signal and a bank specification address signal) issued from a CPU of a computer.

According to the memory device with variable bank partition architecture of another aspect of the present invention, data input from the data input terminals is stored in all access units in a memory address area corresponding to a bank specified by a bank specification address signal input from an address terminal dedicated to an operation for writing data of those obtained by dividing a memory address space based on a number of divisions specified by a bank level signal, and further data at a memory address specified by an address signal input from an address terminal dedicated to an operation for reading out data is output from data output terminals. Accordingly, data write and data read can be executed independently and asynchronously, and throughput of a CPU can be improved.

According to the memory device with variable bank partition architecture of still another aspect of the present invention, data input from data input terminals is stored in all access units in a memory address area corresponding to a bank specified by a bank specification address signal input from the address terminal dedicated to an operation for writing data among those obtained by dividing a memory address spaced based on a number of divisions specified by a bank level signal, and data at memory addressed sequentially and automatically specified among specified memory addresses is output in response to input of a synchronizing clock. Therefore, in addition to the effect described above, since bit data in an access unit corresponding to a specified memory address is sequentially output, when continuous data is read out, the necessity of specifying memory addresses one by one, and work load for memory access by a CPU or a memory controller can be reduced.

Further, a memory address space is divided into a plurality of banks according to a first division unit, an address identifying each bank is assigned to each of the banks obtained by dividing the memory space, each of the banks obtained by dividing the memory address space according to the first division unit is further divided into a plurality of banks according to a second division unit, an address identifying a bank is assigned to each of the banks obtained by the upper bank, and thus division of a bank and assignment of an address are repeatedly executed according to the necessity and a particular area of the memory address space is specified. Therefore, an instruction can efficiently be given to each area in which the same data is to be stored by specifying addresses of upper and lower banks, and the work load on the CPU can be reduced.

Further, a memory address space is divided into four banks each having a quarter size of the original one, 2-bit addresses of "00", "01", "10", and "11" are assigned to the banks, each of the banks is further divided into four banks, 2-bit addresses of "00", "01", "10", and "11" are assigned to the banks respectively, and thus division and assignment of an address are repeated according to the necessity. A particular area in a memory address space is specified with the addresses finally obtained through the division and assignment described above, so that an instruction can efficiently be given to each area in which the same data is to be stored by specifying addresses of upper and lower banks, and work load to a CPU can be reduced. Further, an address is expressed with 2-bit code corresponding to a relative position in each area obtained by quartering a memory address space or an upper bank, so that treatment of an address is quite easy.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A memory device with variable bank partition architecture comprising:
   a memory address space that is divided by a bank unit;
   a plurality of bank level terminals each of which receives a bank level signal for specifying a number of divided banks;
   a plurality of address terminals each of which receives a bank specification address signal for specifying one of divided banks;
   a plurality of data input/output terminals each of which receives a data to be input into a memory address in said memory address space or each of which outputs a data stored at a memory address in said memory address space; and
   a control terminal which receives a control signal for specifying either input or output of the data,
   wherein a memory address area corresponding to a bank specified based on a bank specification address signal of those obtained by dividing a memory address space according to a number specified by the bank level signal is identified based on a bank level signal input from said bank level terminal as well as on the bank specification address signal input from said address terminal,
   data input from said data input/output terminal is written in a storage area indicated by a memory address in said identified memory address area when a control signal input from said control terminal specifies input of data, and
   data stored in said identified memory address area is output from said data input/output terminal when a control signal input from said control terminal specifies output of data.

2. The memory device with variable bank partition architecture according to claim 1, wherein, when a control signal input from said control terminal specifies output of data, any one of a maximum value, minimum value, and average value of data stored in a memory address area identified based on said bank specification address signal is calculated, and the calculated value is output from said data input/output terminals.

3. The memory device with variable bank partition architecture according to claim 1, wherein said memory address space is divided by a first division unit, an address is assigned to each of the divided banks to identify the bank, each of the banks obtained by dividing said memory address space by is further divided into a plurality of banks by a second division unit, an address is assigned to each of the banks obtained by dividing the upper bank by said second division unit, and a specific area in said memory address space is specified with said address obtained by repeating the division of banks and assignment of addresses by a required number of times, wherein the bank level signal is a signal that specifies the number of times the division is to be performed, and the address specification address signal is a signal that specifies any one of the addresses assigned to the divided.

4. The memory device with variable bank partition architecture according to claim 1, wherein the space of the memory address is divided into four banks, 2-bit addresses of "00", "01", "10", and "11" are respectively assigned to the four banks, each of the banks is further divided into four banks, 2-bit addresses of "00", "01", "10", and "11" are assigned to the divided banks, and a specific area of said memory address space is identified with the address obtained by repeating the division and assignment of addresses by a required number of times, wherein the bank level signal is a signal that specifies the number of times the division is to be performed, and the address specification address signal is a signal that specifies any one of the addresses assigned to the divided.

5. A memory device with variable bank partition architecture comprising:

a memory address space that is divided by a bank unit;

a plurality of bank level terminals each of which receives a bank level signal for specifying a number of divided banks;

a plurality of first address terminals each of which receives a bank specification address signal for specifying one of divided banks when data is written;

a plurality of data input terminals each of which receives a data to be input into a memory address in said memory address space;

a plurality of second address terminals each of which receives an address signal for specifying a memory address in said memory address space when data is read out; and a plurality of data output terminals each of which outputs a data stored at a memory address in said memory address space, wherein a memory address area corresponding to a bank specified based on the bank specification address signals of those obtained by dividing a memory address space according to a number specified by the bank level signals is identified based on a bank level signals input from said bank level terminals as well as based on the bank specification address signals input from said first address terminals, and data input from said data input terminals is written in storage areas indicated by memory addresses in said memory address area, and the data stored at the memory addresses specified based on the address signals input from said second address terminals is output from said data output terminals.

6. The memory device with variable bank partition architecture according to claim 5, wherein said memory address space is divided by a first division unit, an address is assigned to each of the divided banks to identify the bank, each of the banks obtained by dividing said memory address space by is further divided into a plurality of banks by a second division unit, an address is assigned to each of the banks obtained by dividing the upper bank by said second division unit, and a specific area in said memory address space is specified with said address obtained by repeating the division of banks and assignment of addresses by a required number of times, wherein the bank level signal is a signal that specifies the number of times the division is to be performed, and the address specification address signal is a signal that specifies any one of the addresses assigned to the divided.

7. The memory device with variable bank partition architecture according to claim 5, wherein the space of the memory address is divided into four banks, 2-bit addresses of "00", "01", "10", and "11" are respectively assigned to the four banks, each of the banks is further divided into four banks, 2-bit addresses of "00", "01", "10", and "11" are assigned to the divided banks, and a specific area of said memory address space is identified with the address obtained by repeating the division and assignment of addresses by a required number of times, wherein the bank level signal is a signal that specifies the number of times the division is to be performed, and the address specification address signal is a signal that specifies any one of the addresses assigned to the divided.

8. A memory device with variable bank partition architecture comprising:

a memory address space that is divided by a bank unit;

a plurality of bank level terminals each of which receives a bank level signal for specifying a number of divided banks;

a plurality of address terminals each of which receives a bank specification address signal for specifying one of divided banks when data is written;

a plurality of data input terminals each of which receives a data to be input into a memory address in said memory address space;

at least one data output terminal which outputs a data stored at a memory address in said memory address space; and a synchronous clock terminal which receives a clock indicating timing for specification of a memory address corresponding to output data, wherein a memory address area corresponding to a bank specified based on the bank specification address signals of those obtained by dividing a memory address space according to a number specified by the bank level signals is identified based on a bank level signal input from said bank level terminal as well as based on the bank specification address signals input from said address terminals, and data input from said data input terminals is written in a storage area indicates by the memory addresses in said identified memory address area, and memory addresses are successively specified from specified memory addresses in said memory address based on clocks input from said synchronous clock terminal, and data stored at the specified memory address is output from said data output terminals.

9. The memory device with variable bank partition architecture according to claim 8, wherein said memory address space is divided by a first division unit, an address is assigned to each of the divided banks to identify the bank, each of the banks obtained by dividing said memory address space by is further divided into a plurality of banks by a second division unit, an address is assigned to each of the banks obtained by dividing the upper bank by said second division unit, and a specific area in said memory address space is specified with said address obtained by repeating the division of banks and assignment of addresses by a required number of times, wherein the bank level signal is a signal that specifies the number of times the division is to be performed, and the address specification address signal is a signal that specifies any one of the addresses assigned to the divided.

10. The memory device with variable bank partition architecture according to claim 8, wherein the space of the memory address is divided into four banks, 2-bit addresses of "00", "01", "10", and "11" are respectively assigned to the four banks, each of the banks is further divided into four banks, 2-bit addresses of "00", "01", "10", and "11" are assigned to the divided banks, and a specific area of said memory address space is identified with the address obtained by repeating the division and assignment of addresses by a required number of times, wherein the bank level signal is a signal that specifies the number of times the division is to be performed, and the address specification address signal is a signal that specifies any one of the addresses assigned to the divided.

* * * * *